(12) United States Patent
Platzgummer

(10) Patent No.: US 8,378,320 B2
(45) Date of Patent: Feb. 19, 2013

(54) METHOD FOR MULTI-BEAM EXPOSURE ON A TARGET

(75) Inventor: Elmar Platzgummer, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 0 days.

(21) Appl. No.: 13/051,714

(22) Filed: Mar. 18, 2011

(65) Prior Publication Data

US 2011/0226968 A1 Sep. 22, 2011

(30) Foreign Application Priority Data

Mar. 18, 2010 (EP) .................................. 10450044

(51) Int. Cl.
*G21G 5/10* (2006.01)

(52) U.S. Cl. ................................... 250/492.22

(58) Field of Classification Search ........... 250/492.1, 250/492.2, 492.22, 492.3, 492.21
See application file for complete search history.

(56) References Cited

U.S. PATENT DOCUMENTS

| | | | |
|---|---|---|---|
| 4,735,881 A * | 4/1988 | Kobayashi et al. ............ 430/30 |
| 5,260,579 A | 11/1993 | Yasuda et al. |
| 5,399,872 A | 3/1995 | Yasuda et al. |
| 5,841,145 A | 11/1998 | Satoh et al. |
| 5,876,902 A * | 3/1999 | Veneklasen et al. ........ 430/296 |
| 6,043,496 A * | 3/2000 | Tennant .................... 250/492.1 |
| 6,049,085 A * | 4/2000 | Ema ........................ 250/492.22 |
| 6,225,637 B1 * | 5/2001 | Terashima et al. ......... 250/492.2 |
| 6,333,138 B1 | 12/2001 | Higashikawa et al. |
| 6,473,237 B2 * | 10/2002 | Mei ............................. 359/619 |
| 7,129,024 B2 | 10/2006 | Ki |
| 7,710,634 B2 * | 5/2010 | Sandstrom ................... 359/290 |
| 2002/0021426 A1 * | 2/2002 | Mei et al. ..................... 355/53 |
| 2006/0076509 A1 * | 4/2006 | Okino et al. .............. 250/492.2 |
| 2006/0169925 A1 * | 8/2006 | Miyajima et al. ........ 250/492.22 |
| 2008/0105827 A1 * | 5/2008 | Tamamushi .............. 250/396 R |
| 2008/0237460 A1 | 10/2008 | Fragner et al. |
| 2008/0299490 A1 * | 12/2008 | Takekoshi ................... 430/296 |
| 2009/0101816 A1 * | 4/2009 | Noji et al. ................... 250/310 |
| 2010/0127185 A1 * | 5/2010 | Fragner et al. .............. 250/398 |
| 2011/0053087 A1 * | 3/2011 | Nielsen et al. .............. 430/296 |

FOREIGN PATENT DOCUMENTS

WO 2009/147202 12/2009

OTHER PUBLICATIONS

Disclosed Anonymously, "Multi-tone rasterization, dual pass scan, data path and cell based vector format", IPCOM000183472D, printed from ip.com PriorArtDatabase, published May 22, 2009, 108 pages.

* cited by examiner

*Primary Examiner* — Robert Kim
*Assistant Examiner* — Jason McCormack
(74) *Attorney, Agent, or Firm* — Kauth, Pomeroy, Peck & Bailey LLP

(57) ABSTRACT

For irradiating a target with a beam of energetic electrically charged particles comprising a plurality of beamlets, the target is exposed in a sequence of exposure stripes composed image pixels. These stripes (s1, s2) are, at their boundaries to adjacent stripes, provided with overlap margins (m12, m21) which are mutually overlapped, so nominal positions of image pixels in the overlap margin (m21) overlap, or substantially coincide, with image pixels in the corresponding overlap margin (m12). During the exposure of an overlap margin (m21), a first subset ($n_1$) of image pixels in said overlap margin are exposed while those of a second subset ($n_2$), possibly a complementary subset with respect to a desired pattern, are not exposed; contrariwise, during the exposure of the corresponding overlap margin (m12), image pixels corresponding to image pixels in the first subset are not exposed, but those corresponding to image pixels in the second subset are.

17 Claims, 4 Drawing Sheets

METHOD FOR MULTI-BEAM EXPOSURE ON A TARGET

CROSS-REFERENCE TO RELATED APPLICATIONS

The current application claims priority to European Patent Application No. 10450044.2, filed Mar. 18, 2010, the disclosure of which is incorporated herein by reference in its entirety.

FIELD OF THE INVENTION AND DESCRIPTION OF PRIOR ART

The invention relates to an improved method for irradiating a target with a beam of energetic radiation, for example in the form of electrically charged particles, which beam is composed of a plurality of sub-beams ('beamlets'). More in detail, the beam used to irradiate or expose the target is defined in a pattern definition means having a plurality of apertures transparent to said (particle) radiation, and by illuminating said pattern definition means with an illuminating wide beam, the latter traverses the pattern definition means through the apertures, forming a patterned beam ('multi-beam') consisting of a corresponding plurality of beamlets; this patterned beam is formed into an image on the location of the target, which image comprises the images of at least part of the plurality of apertures; furthermore, a relative movement between said target and the pattern definition means is generated so as to produce a movement of said pattern image on the target along a path over a region where a beam exposure is to be performed, which defines a number of stripes covering this region. The stripes will, at their boundaries to adjacent stripes, comprise overlap margins, which are brought into spatial overlap with a respective corresponding overlap margin of an adjacent stripe.

A multi-beam method of this kind and a pertinent particle-beam apparatus is disclosed in the U.S. Pat. No. 6,768,125 of the applicant/assignee, which is hereby incorporated into the present disclosure as relevant prior art. That patent describes a charged-particle lithography and processing method and apparatus dubbed PML2 (short for "Projection Mask-Less Lithography") which realizes a multi-beam direct write concept and uses a programmable aperture plate system (APS) as a pattern definition (PD) device for structuring a particle beam, which is extracted from a single source of electrically charged particles.

Particle lithography and processing is used in semiconductor production and microstructuring applications of a target, such as a wafer substrate. With regard to the present invention the terms 'target' and 'substrate' are used without difference in meaning. In particular direct patterning by ion-beam irradiation is a promising concept for the future industrial fabrication of nano-scale devices with high resolutions, in particular the 32 nm and 22 nm nodes and below. The PD device is, preferably, a programmable multi-aperture device. The implementation of a multi-beam projection optical system based on a programmable multi-aperture plate allows a significant improvement of the achievable productivity in comparison with focused single beam systems. The reasons for the improved productivity are, firstly, the parallelism of the process using a plurality of beams and, secondly, the increased current which can be imaged to a substrate at the same resolution. Both are made possible by a significantly reduced Coulomb interaction in the beam. Furthermore, the moderate current density related to the projection optical system results in an enhanced process rate when precursor gases are used for beam-induced chemical processes. As compared with a focused beam system, also the reduced heating effect due to extreme beam intensity can be avoided.

In a multi-beam layout like the PML2 layout as disclosed in the U.S. Pat. No. 6,768,125 and related prior art, the particle beam is used to expose a plurality of pixels on the target. In this disclosure the expression "pixel" is used for a single grid point of the (so-called) physical exposure grid, i.e. the grid at which the target is exposed by individual exposures, that eventually generate the desired pattern when being transferred to the target. By definition, pixels have the same geometric spot size, but may be exposed to get different doses (varying from 0 to 100%). Each exposure spot at the location of a pixel is the result of the imaging of the corresponding aperture in the PD device onto the target. The exposure spot size related to a pixel may also be larger than the pitch of the physical exposure grid (i.e. larger than pitch at which pixels are placed next to each other); if the size of an exposure spot is in the order of a multiple of this pitch, one also talks about interlocking grids, which are discussed extensively in U.S. Pat. No. 7,275,714 of the applicant/assignee. Moreover, in general, several beams may contribute to the dose of one pixel if a redundant writing mode is used. However, it is emphasized that the method according to the invention described in the following is independent of the geometrical realization and arrangement of the individual pixels within the exposure grids.

Physically, a pixel exposure is generated, for example, by switching "on" and "off" an individual beamlet at the position of that pixel for a certain time (a method to switch "on" and "off" selected beamlets is described further below). The positions of the pixels on the target is shifted between consecutive pixel exposure cycles, so as to cover the entire area that is to be exposed on the target. Thus, a sequence of pixel exposure cycles will result in the exposure of stripes on the target. In prior art, parallel stripes are usually written side-to-side in order not to leave out any pixels unexposed on the target. An example of such a proceeding is shown in FIG. 5 where three adjacent stripes are shown, with a scanning direction running to the left in the drawing. These stripes abut at their sides so as to cover the entire area on the target that is to be exposed.

This strategy, however, is very susceptible to imaging errors which are caused by errors in the metrology. For instance, as illustrated in FIG. 6, already a small misalignment of the scanning directions may leave wedge-shaped areas on the target unexposed, with other areas having double exposure. In a similar fashion other deviations (not shown) may cause problems: for instance, a deviation in the scale factor produced at the target (such as a small deviation in the demagnification) and/or transversal misplacement (i.e., a shift transverse to the scanning direction relative to the adjacent stripe) will cause like effects, namely additional exposure gaps or double exposure. Also a differential longitudinal shift (i.e., a shift of one stripe relative to an adjacent stripe) is problematic, although it will not cause double or missing exposure, but it will likely cause unwanted dislocations in the pattern. Such errors in the mutual alignment of stripes are commonly referred to as butting errors. While such stripe-to-stripe butting errors can be minimized by proper metrology methods, a residual amount of butting errors may occur due to unavoidable metrology tolerances.

An electron beam lithography method is discussed in U.S. Pat. No. 7,129,024 (Ki), wherein the stripes are extended so that the boundaries of the stripes overlap adjacent stripes at each boundary. The stripes are then sequentially exposed using the electron beam. Within an extended region of a stripe that scan dose of the electron beam is less than the scan dose of the electron beam for a non-extended region of the stripe. Also U.S. Pat. No. 6,258,511 (Okino) describes the use of subfields which are exposed at half the exposure time amount and mutually overlapped.

This overlapping approach requires a modulation of the beam with respect to the dose that is imparted to a pixel on the target, either by varying the electron beam exposure scan dose or by reducing the exposure time. The former approach, varying the dose of the beam is not possible for a part of the beamlets in a multi-beam setup where a complete set of pixels is exposed simultaneously. A variation of the exposure time for only a part of the pixels is possible only with an increased expense of the controlling logic in the blanking system.

Gray scale methods, such as those proposed in U.S. Pat. No. 7,368,738 could be used for emulating a variation of the beam dose. A gray scale refers to the possibility that pixels in a pattern or not only exposed either totally or not at all, but can have intermediate values ('gray values'), by employing partial exposures of the pixels on the target. However, the use of gray scale for overlapping stripes may interfere with the realization of actual gray scales on the target, in particular for patterns that use gray scales extensively. Therefore, an alternative to using gray scales in multi-beam exposure methods is sought.

With regard to using gray values it is worthwhile to point out that the situation with a multi-beam system underlying the invention is different from that with a conventional single-beam system (such as a Gaussian beam or variable shaped beam system). In a single-beam system the dose adjustment (gray level per shot) can be usually performed in very fine steps, while the fundamental limit for the productivity originates from the limited beam deflection rate and accuracy. In a multi-beam irradiation apparatus the number of possible gray levels per beam has to be limited in general because of the total data rate constraints which are related to external data rate of the pattern definition device (typically 4 bit to 8 bit per beam, which translates into a total rate of 15-150 Gbit/s, depending on the number of parallel beams and toggling rate). Due to the inherent limitation of the PML2-like multi-beam irradiation apparatus fine placement of pattern edges and CD control has to be achieved by a gray level writing strategy, as described for example in U.S. Pat. No. 7,275,714. Furthermore, in order to account for the so-called proximity effect (which is due to forward and backward scattering of particles that give rise to an additional exposure of the resist), gray levels may be also exploited to correct for proximity effects by implementing a local dose correction. Hence, in case of a multi-beam irradiation apparatus it is highly desired to preserve the available number of gray levels for the above mentioned adjustments, rather than using gray levels for realizing stripe overlay regions in order to emulate partial exposures as with the methods described in prior art.

SUMMARY OF THE INVENTION

The invention aims at improving the use of overlapping stripes to reduce the impact of such unavoidable butting errors, avoiding the shortcomings of prior art and exploiting the special potential offered by multi-beam exposure strategies, in particular those used in a PML2 setup.

This object is achieved, starting from a method as set out at the beginning wherein the exposure stripes, at their boundaries to adjacent stripes, comprise overlap margins, and each overlap margin in a stripe is brought into spatial overlap with a corresponding overlap margin of an adjacent stripe, by means of the following method according to the invention: Nominal positions of image pixels in the overlap margin are overlapping with nominal positions of corresponding image pixels in the corresponding overlap margin. Furthermore, during the exposure of a (first) overlap margin, a first subset of image pixels in the overlap margin are exposed while a second subset of image pixels in the same overlap margin are not; during the exposure of a corresponding overlap margin (i.e. a second overlap margin of another stripe which overlaps the first overlap margin), image pixels in this second overlap margin which correspond to image pixels in said first subset (of the first overlap margin) are not exposed, but image pixels in this second overlap margin which correspond to image pixels in said second subset are.

This approach departs from the principle of prior art to keep the patterns within the overlaid margins the same; rather, some pixels are exposed only during the exposure of one stripe (overlap margin), and other pixels are exposed only during the exposure of the other, adjacent stripe (corresponding overlap margin). By virtue of the superposition of the two pattern components that is effected by the overlap of the margins, the original stripe is recovered. In the case that a butting error occurs, the two pattern components are not exactly coinciding, but due to the inherent blur of a particle-optical system, a resulting pattern will be generated that contains only small deformation as compared to the nominal pattern. In fact, the resulting pattern generated by the overlay will be intermediate between the component patterns and continuously connect the parts of the pattern in both main parts of the stripes. Thus, the invention helps to avoid an abrupt offset at the boundary between stripes that could occur with prior-art methods as a consequence of butting errors.

It is worthwhile to note that the method according to the invention does not require that all pixels within the overlap region are exposed in the exposure run of either the first stripe or the second stripe; in particular, there may be pixels that are not exposed in both runs, in particular when the pattern to be exposed stipulates regions and/or individual pixels to be left without any exposure dose.

The method according to the invention offers a simple procedure for realizing a transition between adjacent exposure stripes and does not impose the need for added complexity in the APS system. In fact, the invention requires that certain parts of the pattern are simply blanked out. The choice regarding which parts can be made beforehand during the layout of the pattern and partitioning into exposure stripes. In particular, the method does not affect the treatment of gray values in the pattern.

In a further aspect of the invention, the first and second subsets are complementary with regard to the numbers of image pixels in a pixel pattern that is being generated on the target within an overlap margin.

In an advantageous development of the method according to the invention, the ratio of the number of image pixels in the first subset to the sum of numbers of image pixels in the first and second subsets (i.e., $n_1/(n_1+n_2)$ is decreasing towards an outer boundary of the overlap margin along a direction transverse to the direction of the path defining the respective stripe. This ratio may decrease in a stepwise manner in a sequence of consecutive sub-regions in the overlap margin. The number of these consecutive sub-regions may generally be any value starting from two, suitable values are, for instance, $n^2 1$ (for $n \geq 2$) or $2^{2i} 1$ (for $i \geq 1$).

In general, the ratio may, within an overlap margin, take at least two different values greater than 0 and smaller than 1, where the number of different values may, for instance, be $n^2 1$ or $2^{2i} 1$ as already mentioned.

This ratio can suitably be taken such that it is expressed with regard to sampling cells of uniform size within the respective overlap margin or sub-region. These sampling cells may, for instance, be blocks of adjacent image pixels, for example rectangular blocks or square blocks.

Furthermore, it is advantageous to realize the overlap between the pixels involved in the overlap margins overlaid in such a way that the nominal positions are coinciding, at least substantially, i.e., omitting small misalignments which are well below the imaging resolution of the optical system, in particular misalignments which are below the allowable placement error of the pattern on the target. A typical value of an allowable placement error is 3 nm.

The method according to the invention is of particular advantage in combination with an arrangement realizing interlocking grids, wherein the exposure spots, i.e. the images of apertures formed on the target, have a width that is greater than the distance between neighboring positions of image pixels within each stripe (cf. U.S. Pat. No. 7,275,714). In this case, as suitable way to choose the above-mentioned sampling cells may be such that the cells comprise a number of pixels corresponding to the number of pixels covered by a single exposure spot on the target. The width of the exposure spots, when expressed in terms of the distance between neighboring image pixel positions, may have a value whose integer part is (or a value roughly equal to an integer that is) at least 2, for instance $2^N$ (for $N \geq 1$).

The present invention is not only functional with particle-beam implementations, but is also suitable for use in EUV or X-ray systems, or in general, systems using electromagnetic radiation that is sufficiently energetic, or has a suitable frequency, to expose and/or structure a target. In the latter case, the pattern definition means will, rather than apertures, have a plurality of mirror elements configured to reflect said radiation, and by reflecting the radiation at said mirror elements in the pattern definition means, a patterned beam consisting of a corresponding plurality of beamlets of this radiation is formed and imaged to the target, where the pattern image is formed by images of the mirror elements. The blanking of the beamlets (switching on or off) is then achieved by tilling of the mirror elements. This being said, it will be clear that the implementation of the invention in systems which use electromagnetic radiation in place of particle radiation is completely analogous, in particular with regard to the strategy of exposing the target along exposure stripes which are provided with overlap margins, and the exposure of pixels in separate strips according to subsets as outlined above and further explained in detail below.

BRIEF DESCRIPTION OF THE DRAWINGS

In the following, the present invention is described in more detail with reference to the drawings, which show.

DETAILED DESCRIPTION OF THE INVENTION

The preferred embodiment of the invention discussed in the following is a development of the PML2-type particle-beam exposure apparatus and its pattern definition (PD) system, as disclosed in the above-mentioned U.S. Pat. No. 6,768, 125 and US 2009/0200495 A1, having a large-reduction projecting system. In the following, first the technical background of the apparatus is discussed as far as relevant to the invention, then embodiments of the invention are discussed in detail. It should be appreciated that the invention is not restricted to the following embodiments or the particular layout of PD systems, which merely represent examples of possible implementations of the invention; rather, the invention is suitable for other types of processing systems that employ a particle-beam and a multi-beam patterning as well.

PML2 System

Figure 1:
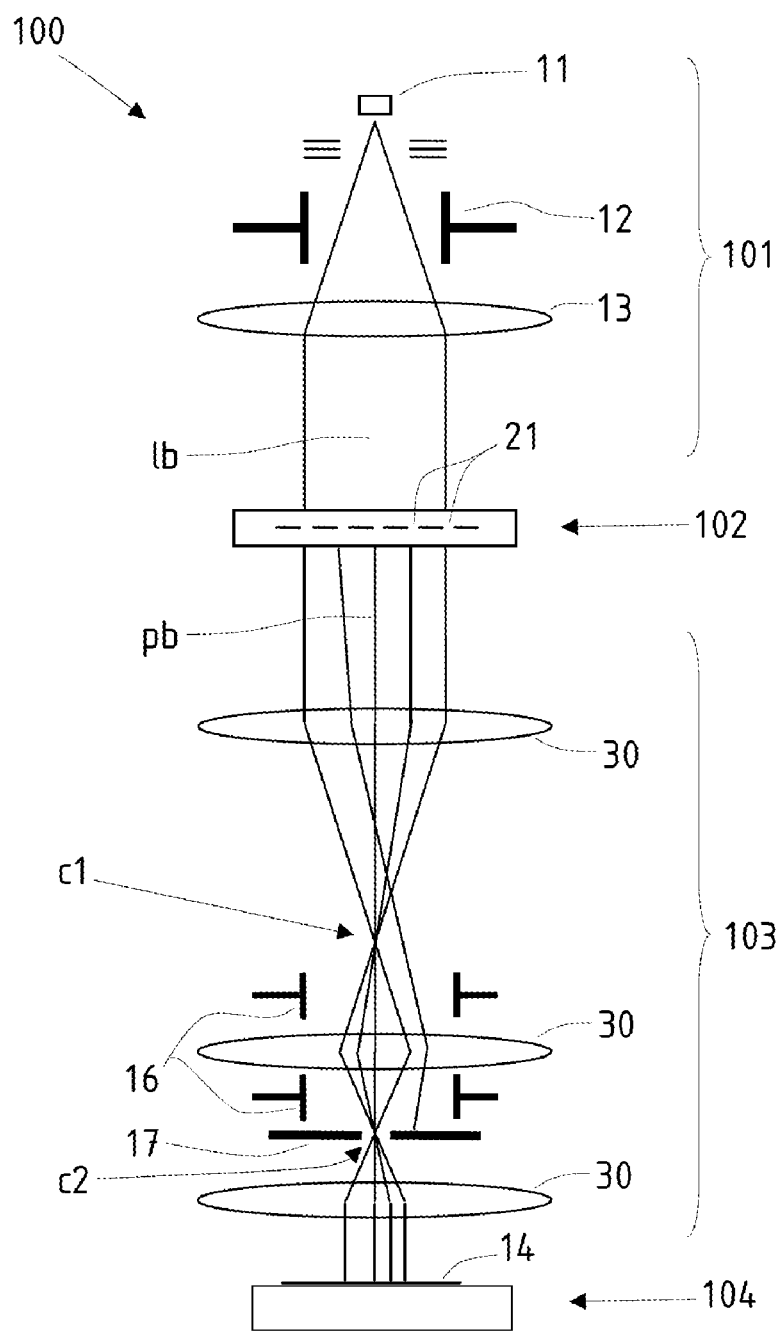
FIG. 1 is a schematic overview of a particle-beam exposure apparatus suitable for the invention in a longitudinal section.

A schematic overview of a projection maskless lithography particle-beam processing apparatus PML2 employing the invention is shown in FIG. 1. In the following, only those details are given as needed to disclose the invention; for the sake of clarity, the components are not shown to size in FIG. 1, particularly the lateral width of the particle beam is exaggerated. For more details, the reader is referred to the U.S. Pat. No. 6,768,125 and US 2009/0200495 A1, whose teachings with respect to the overall layout of the particle-beam apparatus and the PD means are herewith included by reference.

As already mentioned, a particle beam generated by a particle source is used in the PML2 system. An illumination charged-particle optical system forms the beam into a wide beam which illuminates a PD means having a regular array of apertures in order to define a beam pattern to be projected on a target surface. With each aperture, a small beam (also referred to as 'beamlet') is defined, and the passage of each beam through an aperture can be controlled so as to allow ('switch on') or effectively deactivate ('switch off') the passage of particles of the beam through the apertures and/or subsequent demagnifying charged-particle projection optics towards the target. The beam permeating the aperture array forms a patterned particle beam bearing pattern information as represented by the spatial arrangement of the apertures. The patterned beam is then projected by means of a demagnifying charged-particle optical projection system onto the target (for instance, a semiconductor substrate) where an image of those apertures whose corresponding beams are not deflected is thus formed to modify the target at the irradiated portions. The image formed by the beam is moved along a straight path over each die field; this (large-scale) motion is usually achieved by a continuous motion of the target stage, possibly with fine adjustment of the projection system. An additional scanning of the beam in a direction perpendicular to the scanning direction is done only for short distances, for instance to compensate for lateral travel motion errors of the scanning stage and furthermore in the case of specific exposure techniques (cf. below with reference to FIG. 4).

The main components of the apparatus 100 are—in the order of the direction of the lithography beam lb, pb which in this example runs vertically downward in FIG. 1—an illumination system 101, a PD system 102, a projecting system 103, and a target station 104 with the target or substrate 14. The charged-particle optical systems 101, 103 are realized using electrostatic and/or electromagnetic lenses. The charged-particle optical parts 101,102,103 of the apparatus 100 are contained in a vacuum housing (not shown) held at high vacuum to ensure an unimpeded propagation of the beam lb, pb along the optical axis of the apparatus.

The illumination system 101 comprises, for instance, an electron or ion source 11, an extractor arrangement defining the location of the virtual source, a general blanker 12, which in the case of using ion beams may also be used as particle filter, and an illumination charged-particle optics realized by a condenser lens system 13. The ions used can be, for instance, hydrogen ions or heavy ions; in the context of this disclosure heavy ions refer to ions of elements heavier than C, such as O, N, or the noble gases Ne, Ar, Kr, Xe. Apart from ions, the particles can be electrons (emitted from an electron gun) or, in general, other electrically charged-particles can be used as well.

The particle source 11 emits energetic electrons or ions of primarily a certain species, such as hydrogen or $Ar^+$ ions having a defined (kinetic) energy of typically several keV (e.g. 5 keV at the PD system 102) with a comparatively small energy spread of, e.g., E=1 eV. A velocity/energy dependent filter 12 serves to filter out other, unwanted particle species that may also be produced in the source 11; the filter 12 may also be used to blank out the beam as a whole during repositioning of the beamlets. By means of a particle optical condenser lens system 13, the charged particles emitted from the source 11 are formed into a wide-area, substantially telecentric beam serving as lithography beam lb.

The lithography beam lb then irradiates a PD device which, together with the devices needed to keep its position, forms the PD system 102. The PD device is held at a specific position in the path of the lithography beam lb, which thus irradiates an aperture pattern formed by a plurality of apertures 21. As already mentioned, each of the apertures can be "switched on" or "open" so as to allow the beamlet passing through the respective aperture to reach the target; it is then said, the aperture is transparent to the incident beam. Otherwise, the aperture is "switched off" or "closed", in which case the beam path of the respective beamlet is affected (e.g. by means of deflector electrodes to which a transverse voltage is applied) in a way that it will be absorbed or otherwise removed out of the beam path before it can reach the target; thus, the aperture is effectively non-transparent or opaque to the beam. The pattern of switched-on apertures is chosen according to the pattern to be exposed on the substrate, as these apertures are the only portions of the PD device transparent to the beam lb, which is thus formed into a patterned beam pb emerging from the apertures (i.e., in FIG. 1, below the PD system 102). The architecture and operation of the PD device, in particular with regard to its blanking plate, is discussed in detail below. In FIG. 1 only five beamlets are shown in the patterned beam pb, while it will be clear that the actual number of beamlets is very large, i.e. typically many thousands; of the beamlets shown, the second from the left is depicted switched off as it is absorbed on an absorbing plate 17; the other beamlets, which are switched-on, pass through a central opening of the plate 17 and thus are projected onto the target.

The pattern as represented by the patterned beam pb is then projected by means of a charged-particle optical projection system 103 onto the substrate 14 where it forms an image of the switched-on apertures. The projection system 103 implements a demagnification of, for instance, 200. The substrate 14 is, for instance, a silicon wafer covered with a particle sensitive resist layer. The wafer 14 is held and positioned by a wafer stage (not shown) of the target station 104. A detector 15 for secondary radiation can be used to detect the proper positioning of the substrate with respect to the beam.

The projection system 103 is, for instance, composed of two consecutive charged-particle optical projector stages with a crossover c1, c2, respectively. The electrostatic lenses 30 used to realize the projectors are shown in FIG. 1 in symbolic form only as technical realizations of electrostatic imaging systems are well known in the prior art; in other embodiments of the invention, also magnetic and/or electromagnetic lenses may be included as suitable. The first projector stage images the plane of the apertures of the PD device to an intermediate image which in turn is imaged onto the substrate surface by means of the second projector stage. Both stages employ a demagnifying imaging through crossovers c1,c2; thus, while the intermediate image is inverted, the final image produced on the substrate is upright (non-inverted). The demagnification factor is about 14 for both stages, resulting in an overall demagnification of 200. A demagnification of this order is in particular suitable with a lithography setup, in order to elevate problems of miniaturization in the PD device. The charged-particle optical lenses are mainly composed of electrostatic electrodes, but magnetic lenses may also be used.

Further details of the optical system can be found in the above-cited prior art.

As a means to introduce a small lateral shift to the image, i.e. along a direction perpendicular to the optical axis cx, deflection means 16 are provided in one or both of the projector stages. Such deflection means can be realized as, for instance, a multipole electrode system, as discussed in the U.S. Pat. No. 6,768,125. Additionally, an axial magnetic coil may be used to generate a rotation of the pattern in the substrate plane where needed. The lateral deflections are usually quite small in comparison to the lateral width of the patterned beam by itself, in most cases in the order of a few widths of a single beamlet or the distance between neighboring beamlets, but still at least one order of magnitudes below the beam width (it should be appreciated in this context that the lateral distance between beamlets is considerably smaller than the entire width of the beam bp).

Pattern Writing Using Exposure Stripes

By virtue of the pattern formed in the PD system 102, an arbitrary beam pattern can be generated and transferred to a substrate.

Figure 2:
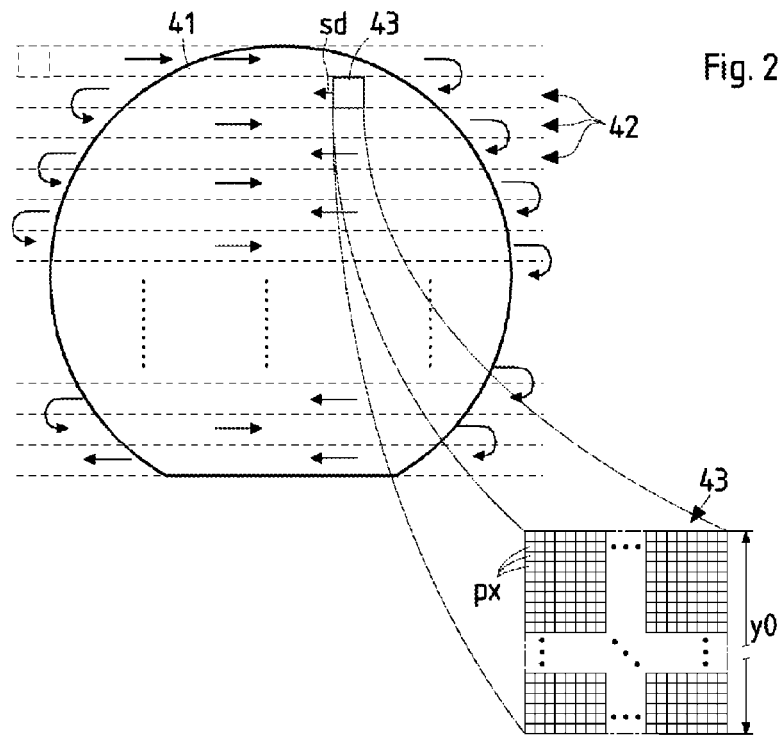
FIG. 2 illustrates an exposure stripe writing strategy on a target.

Referring to FIG. 2, the image field mf formed by the PD system 102 on the target, which is, for instance, shown as a resist-covered wafer 41, has a finite size which is usually well smaller than the target itself. Therefore, a scanning stripe exposure strategy is utilized, where the target is moved under the incident beam, so as to change the position of the beam on the target perpetually: the beam is effectively scanned over the target surface. In the embodiment shown, it is the target which effects the (large-scale) movement, so a beam-scanning strategy is not required for the large-scale movement; it is emphasized that for the purpose of the invention only the relative motion of the image field mf on the target is relevant.

The relative movement of target and beam is realized such that the image field mf is moved over the surface of the target 41 so as to form a sequence of stripes s0 (exposure stripes, also referred to as scan lines). The width of each stripe 42 corresponds to the width y0 of the image field 43 perpendicular to the scanning direction sd. The complete set of stripes covers the total area of the substrate surface. In order to minimize the path length of the movement, the scanning direction sd may alternate from one stripe to the next (boustrophedonal motion). In other embodiments the scanning direction may be the same for all stripes, for instance from the right to the left in FIG. 2, with a quick repositioning of the image from the end of one stripe (which would then be at the left in FIG. 4) to the start of the next stripe (at the right). The repositioning between stripes will generally be done using a common blank-out of the beam as described in US 2009/0200495 A1 of the applicant/assignee.

From the above it is clear that the image field 43 is composed of a plurality of pattern pixels px. It should be appreciated, however, that only a subset of the pixels px can be exposed simultaneously since only a finite number of apertures is present in the aperture field of the PD system. The pixels which can be exposed simultaneously are hereinafter referred to as primary pixels p1 (see FIGS. 3 and 4 for possible spatial arrangements of primary pixels). It will be appreciated that the primary pixels p1 are the image of the apertures in the PD system, so they reproduce the spatial arrangement of the apertures in the aperture means of the PD system, though at a different scale (because of the demagnification of the optical system). In a sequence of consecutive pixel exposure cycles, the image field 43 is swept over the target (which is achieved by a movement of the target, a movement of the beam, or a proper combination of both) so as to expose all pixels px on the target in successive way.

Figure 3:
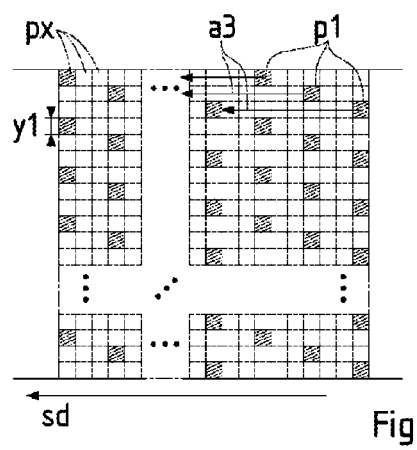
FIG. 3 shows an arrangement of primary pixels that are exposed simultaneously in the image field into staggered lines.

FIG. 3 shows one possible arrangement of a grid of primary pixels p1 within the basic lattice of pattern pixels. The primary pixels p1 are in a staggered grid so in each pixel line (which are the lines parallel to the scanning direction sd) there are the same number of primary pixels p1, and the position of the primary pixels p1 varies from one pixel line to the next, in a typical implementation in a regular manner. The advantage of this layout is that the complete stripe can be exposed by the primary pixels p1 in a sequence of exposures with the target proceeding in a linear motion as illustrated by arrow lines a3. Thus, it is sufficient to move the image field 43 on the target in a linear manner along the scanning direction sd, and the set of primary pixels, as illustrated by the arrow lines for the three primary pixels p1 in the upper right corner, will cover all pattern pixels px without the need of extra movement of the image transverse to the scanning direction.

Figure 4:
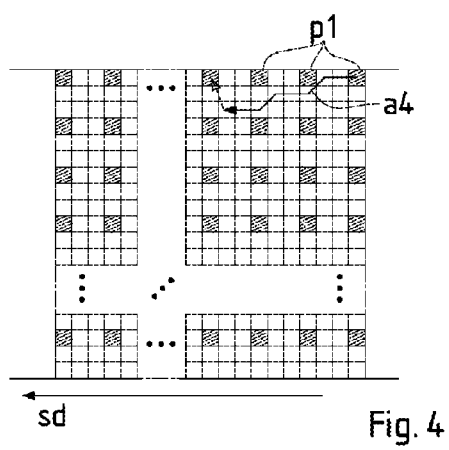
FIG. 4 shows another arrangement of primary pixels according to a rectangular grid.

FIG. 4 shows another possible arrangement of the grid of primary pixels p1 within the basic pattern pixel lattice, namely, in a regular rectangular grid; in this case, it is a square-like grid ('quad grid') with a 3×3 spacing in the basic lattice. In this case, an additional transverse movement is made during the motion of the image along the scanning direction so the primary pixels p1 can cover all pattern pixel positions px on the target. The transverse movement can be provided, for instance, by the deflection means 16, as exemplarily illustrated by the stepped arrow line a4. After a number of pixels have been exposed in different pixel lines, the movement shifts back to the original pixel line (plus a linear displacement along the direction sd as effected during the time interval lapsed). Thus, the amplitude of the transverse movement can be small; it will be appreciated that the amplitude is in the order of the mutual distance of beamlets (equivalent to the width of a beamlet multiplied by a small number, typically 2 to 8; in FIGS. 3 and 4, this number is 3; on the target plane, the width of a beamlet is also equivalent to the width y1 of a pixel p1). This variant simplifies the geometric layout of the aperture arrangement in the PD device as compared to a staggered layout as shown in FIG. 3.

It is further worthwhile to note that in an actual pattern not all pixels are exposed at the full dose, but some pixels will be "switched off" in accordance with the actual pattern; for any primary pixel (or, equivalently, for every beamlet) it can vary from one pixel exposure cycle to the next whether the pixel is "switched on" or "switched off", depending on the pattern to be exposed or structured on the target. For the description of the present invention, however, the realization of the actual pattern is irrelevant. Therefore, in the following description, the fact that individual selected beamlets may be switched off is left out of consideration; all beamlets are always shown as switched on (active on the target), as if the pattern exposed is a full cover of the target area. It should be kept in mind that in an actual implementation a pattern will be superimposed which will require that a considerable number of the beamlets will be switched off in the course of irradiation of the target.

Figure 5:
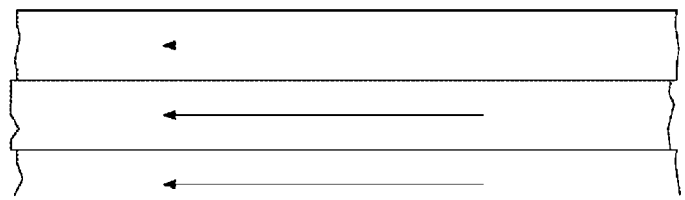
FIG. 5 illustrates the writing of adjacent stripes as a reference for the following drawings.
Figure 6:
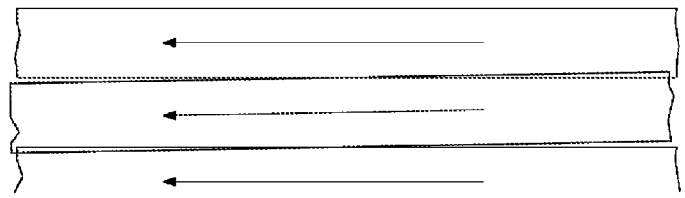
FIG. 6 illustrates a possible misalignment of the stripes of FIG. 5.

The writing of parallel stripes according to prior art has been described above with reference to FIGS. 5 and 6. In order to improve the transition of features across the boundary between adjacent exposure stripes, even when butting errors should occur, the invention proposes a exposure method which is based on overlap margins, but uses an improved strategy in the context of multi-beam exposure.

Overlap Margins

Figure 7:
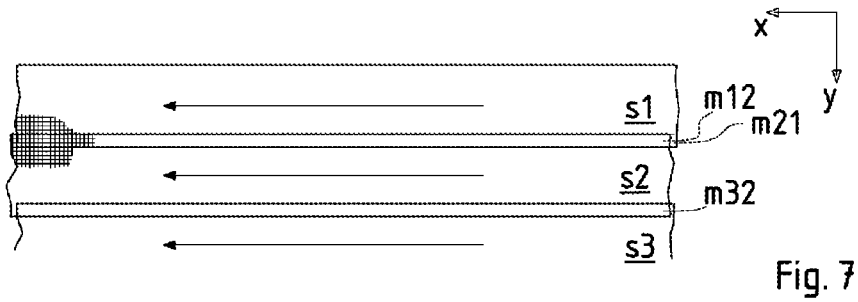
FIG. 7 illustrates stripes having overlap margins according to the invention.

FIG. 7 shows an efficient approach to alleviate the effect of such misalignment between stripes. The stripes s1, s2, s3 are arranged such that they overlap in a margin-like regions which are referred to as overlap regions m12, m23. The width of each overlap region is small as compared to the width of a stripe, but still is well larger than the width y1 (FIG. 3) of a pixel taken across the scanning direction. In FIG. 7 at the left-hand end of the overlap margin m12 pixels are depicted in a symbolic manner; it should be noted that in a realistic implementation of the invention, the number of pixel lines in an overlap margin is considerably higher, typically in the range of several tens up to a few hundreds.

Thus, the stripes are provided with at least one overlap margin, typically two overlap margins, which are located at either edge of a stripe. For instance, in FIG. 7 stripe s2 is extended by adding overlap margins m12 and m23, which each correspond to respective like overlap margins of the adjacent stripes s1, s3. By superimposing overlap margins of adjacent stripes a continuous image pattern is recovered on the target. Within the range of an overlap on the target as defined by the overlap of two adjacent stripes, the exposure is effected partially in the course of exposure of the overlap margin of the first of the two stripes, and partially in the course of exposure of the second one; the two exposures will combine so as to produce a full exposure equivalent to the main part of the stripes (i.e., the region of the stripes without overlapping).

In prior art it was suggested that the partial exposure is achieved by modulating the irradiation dose such that the exposure dose in an overlap margin of one stripe is one half of the full exposure; this would be combined with the other half of the exposure dose in the mating overlap margin so as to yield one full exposure in the overlap region. In a further development, the values involved may be different fractions which add up to one, and the exposure dose is changed in a stepwise manner, for instance with values of 25%, 50% and 75% as shown in U.S. Pat. No. 7,129,024. Modulation of the exposure dose is, however, difficult to realize in a multi-beam irradiation apparatus which form the main focus of the present invention.

Furthermore, as already discussed above, it is highly desired in the case of a multi-beam irradiation apparatus to preserve the available number of gray levels for adjustments of pattern placement and proximity effects, rather than using gray levels to realize stripe overlay regions in a manner corresponding to methods described in prior art.

In contrast to prior art, the method according to the present invention divides the pixels to be exposed on the target, assigning each pixel in an overlap region to one of the (two) overlap margins that are superimposed at the respective location. The respective dose values of the pixels thus exposed are not changed, regardless of which stripe generates the pixel.

Figure 8:
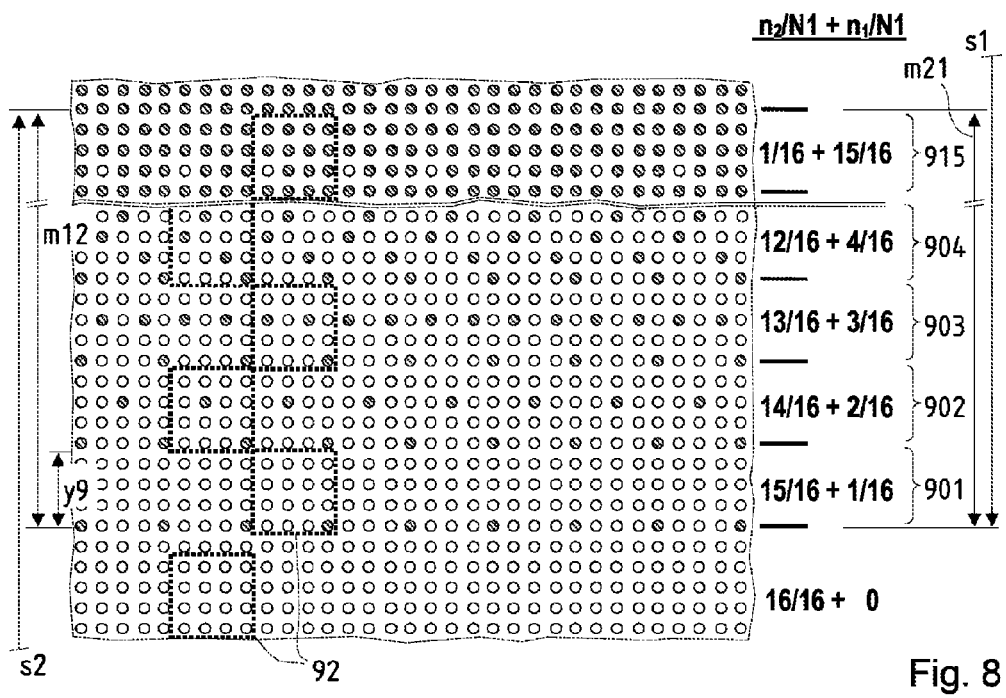
FIG. 8 shows the variation of the exposure fraction implemented by stepwise substitution of pixel exposure according to the invention.

FIG. 8 illustrates this aspect of the invention, for a detail of the region in which the overlap margins m12, m21 of the two stripes s1, s2 of FIG. 7 overlap. Pixel positions (note that exposure spot sizes of the pixels may have geometric sizes that are larger than the circles shown in FIG. 8) of pixels that are exposed in the course of the stripe s1, including the overlap margin m21 belonging to it, are represented by hatched circles; pixels (or pixel positions) that are exposed in the course of stripe s2, including the overlap margin m12 belonging to it, are represented by open circles. In the main region of the stripe s1, shown at the topmost range of FIG. 8, the pixels are exposed with the stripe s1 throughout, whereas the pixels in the main region of the stripe s2, i.e., at the lowermost range of FIG. 8, are exposed with the stripe s2 throughout. In the overlap region formed by the superposition of the overlap margins m12, m21, each pixel is exposed either with stripe s1 or stripe s2. The frequency of pixels belonging to stripe s1 (hatched circles) gradually decreases when going toward the outer edge of the overlap margin m21; i.e., in the drawing, when descending towards the lower edge of margin m21. Contrariwise, the pixels assigned to stripe s2 (open circle) are more and more frequent, upon approaching the main portion of stripe s2.

In a variant, the illustration shown in FIG. 8 can be taken in a way that it only shows the primary pixels, which are then representative for the pattern pixels exposed in a sequence a3, a4, for instance starting from one primary pixel through a number of pattern pixels until a next primary pixel (excluding the final primary pixel). Each circle would then represent a corresponding number of pattern pixels on the target. In the following, the simple term 'pixel' can refer to either kind of image pixel on the target, i.e. a pattern pixel or a primary pixel, as the case may be for either interpretation of the circles in FIG. 8.

According to the invention, the pattern that is exposed with either of the stripes is the same, but during the writing process of each stripe only the pixels assigned to that stripes are used. In the overlap margins, this will result in the complete pattern being recovered since in every overlap margin the pixels are distributed to either of the stripes in a complementary fashion.

In an advantageous development of the invention the frequency of the pixels transitions in a gradual fashion when crossing the overlap margin from its one edge to its other edge. As also visible from FIG. 8, the overlap margin may be divided into a number of parallel sub-regions 901, 902, . . . , 915, referred to as grid tiers hereinafter. Within each grid tier 901 . . . 915 the ratio of pixels assigned to the first stripe s1 as compared to those assigned to the second stripe s2 is substantially uniform, but decreases from one grid tier to the next (or increases, depending on whether one goes downwards or upwards in FIG. 8 transversing the margin). Typically, the width y9 of a grid tier corresponds with the distance of the neighboring beams of the primary pixels p1 (which is 4 pixels in the case of FIG. 8, but 3 pixels in the instances of FIGS. 3 and 4).

As an example, in an interlocking grid with 5 nm pixel distance (5 nm physical grid) and 20 nm exposure spot size, so the spot area of 20 nm×20 nm overlaps with a total number of 16 pixels of 5 nm×5 nm, the smallest tier width y9 may be 20 nm. It will be clear that any larger tier width could be chosen as well, for example to smear out the butting errors over a correspondingly wider length scale as defined by the sum of the widths of the grid tiers. The larger the tier width compared to the feature length of interest, the smaller the butting errors in the overlapping area will get.

In FIG. 8 each grid tier 901 . . . 915 is 4 pixels wide (or, as the case may be, 4 primary pixels wide), and the range of each grid tier is marked at the left side. Additional labels of the form "$n_2/N1+n_1/N1$" give the frequency of pixels (i.e., pattern pixels or primary pixels) exposed with either stripe, expressed as fractions based on sampling cells 92 of uniform size. The labels $n_1$ and $n_2$ designate the numbers of pixels assigned to the first or second stripe s1, s2, respectively, with regard to the pixels of sampling cells containing N1 pixels. In the case shown, the sampling cells are square cells with N1=4×4=16 pixels each. The stripes are numbered starting from the stripe 901 at the outer boundary of the overlap margin m21 towards the main part of the pertinent strip s1; thus, the numbering corresponds to the number m of pixels that are assigned to strip s1. Consequently, the first (or outermost) grid stripe 901, for instance, corresponds to label "15/16+1/16" and the final grid (or innermost) stripe 915 to "1/16+15/16". The outline of one sequence of sampling cells 92 is shown in FIG. 8 as dashed squares. From each grid tier to the next, the number of pixels assigned to stripe s1 increases by just one. The number of grid stripes is, therefore, the number of pixels in a sampling cell minus one (since the values 0 and N1 correspond to the main part of stripes s1 and s2, respectively).

The shape of a sample cell 92 is, for instance, square-like, so the number N1 of pixels in it is typically a square number $n^2$ (n=2, 3, 4, . . . ). Of these, the values with n being a power of two are of special interest, so $N1=2^{2i}$ (i=1, 2, 3, . . . ). The (maximal) number of grid tiers is, as mentioned, the number of pixels in a sample cell minus one, i.e., N11.

Within each grid tier, the pixels belonging to one stripe are dispersed among the pixels belonging to the other. Thus, there is what could be described as interlocking of the grids from by the respective pixels in the overlap margin.

Figure 9:
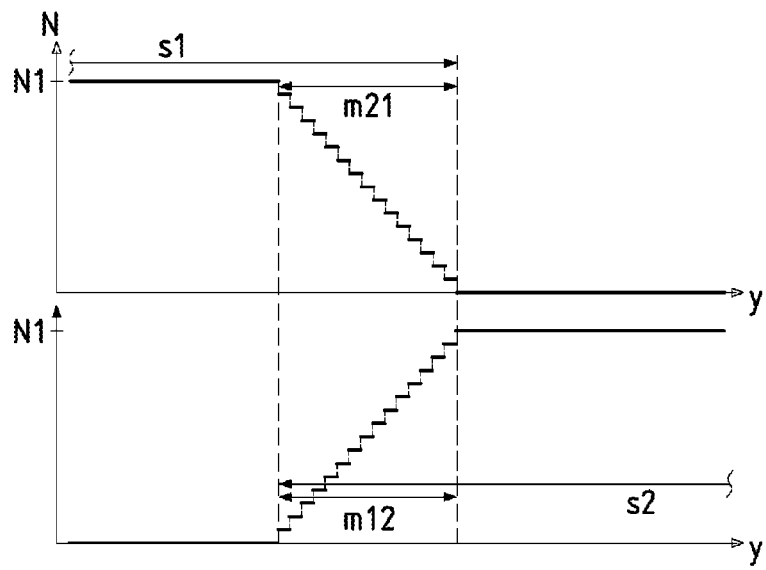
FIG. 9 shows the variation of the exposure fraction in the overlap margin of FIG. 8.

FIG. 9 illustrates the frequency of pixels, for the case that N1=16, when going across the overlap region starting from stripe s1 (left side) to stripe s2 (right side). The frequency of pixels in the overlap region m12, m21, changes in a stepwise manner, realizing a gradual and "quasi-continuous" transition. Each step corresponds to a grid tier 901 . . . 915 of FIG. 8.

It will be clear that beside a grid-tier graduation implementing an increment by one, other graduations are possible as well, in particular using a unique increment value, such as a graduation 0, 4, 8, 12, 16 which realizes 3 intermediate values with an increment of 4 (the initial and final value of the graduation corresponding to the main portion of the respective stripes).

To give only one example of typical dimensions for an implementation of the invention, the width $y^9=n\cdot y1$ of a sample cell with 4×4 pixels (having a width of y1=40 nm) could be 0.16 µm, and with a value of N1=16 the width of an overlap margin is then (N11)·n·y1=2.4 µm for a graduation with an increment of one pixel per grid tier. With an increment of two pixels, the with of the overlap margin would be roughly the half, namely 1.12 µm. This assumes that each grid tier has the width of a sample cell, which is usually a suitable choice of parameters. Another example of dimensions for an implementation of the invention, now for a grid with 5 nm physical grid (pixel size) and 20 nm spot size, i.e. an interlocking grid as mentioned earlier, the width $y9=n\cdot y1$ of a sample cell with 4×4 pixels (having a width of y1=5 nm) would be only 0.02 µm, the geometric size of one exposure spot, and with a value of N1=16 the width of an overlap margin would be then (N11)·n·y1=0.30 μm for a graduation with an increment of one pixel per grid tier.

Softening of Butting Errors

Figure 10A:
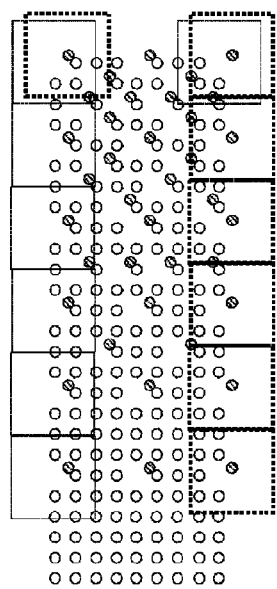
FIG. 10 illustrates how the invention helps to relieve the effect of misaligned adjacent stripes.
Figure 10B:
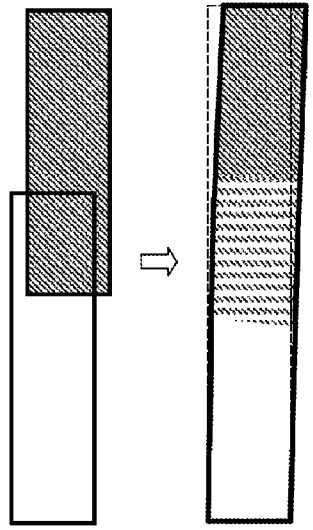

FIGS. 10a and 10b illustrate the benefit of overlap margin according to the invention, namely for the exemplary case that a butting error occurs between adjacent stripes causing a small displacement of one stripe relative to the other. In FIG. 10a, the positions of the pixels are shown, where, in the same manner as in FIG. 8, the pixels are denoted by hatched or open circles for the first or second stripe; in addition, full squares and dashed squares denote grids in the overlap margins as a guideline to the eye. In addition to the pixels depicted in FIG. 10a it will be clear to persons skilled in the art that each pattern pixel will be generated on the target with an inherent blur (not shown in the drawing for the sake of clarity), which blur is of the order of the distance between pixels shown in FIG. 10a. Even more relevant for the smoothing effect is the use of overlapping exposure spots (pixels) that effectively reduce the impact of butting errors on the pattern, because then the impact of a butting error can be distributed over even more steps in the exposure grid (as compared to what they would have in a non-overlapping pixel arrangement). As a result, as illustrated in FIG. 10b, the transition between the exposure stripes according to the invention "stretches" out the butting error to small steps, for instance of 1/N1=1/16 of the actual displacement offset. Thus the error in the critical dimension (CD) caused by a butting error is not localized at a border edge of the stripes involved; rather, the invention will "stretch" or "smear" out the error over the range of the overlap margin. For instance, with reference to FIG. 10b, a vertical line (i.e., running perpendicular to the scanning direction) of a length of e.g. 320 nm along the x-direction crosses the boundary between stripes. A butting error causing a placement error of e.g. 2 nm (displacement by a horizontal vector) will then be stretched out to a line deformation of 2 nm/16=0.25 nm, in place of a abrupt displacement of 2 nm which would occur without using an overlap margin. Another very important specification is the CD control. Assuming, as another example (not shown), a horizontal line which lies inside the overlay region, the CD of this line would be changed by a vertical butting error of 2 nm only by 0.25 nm if the line width is in the range of one tier width, 2*0.25 nm if it is two tier widths, and is reduced to a value of virtually zero if the line width is significantly smaller than one tier width; this last case is the most common case for critical features (for the case of horizontal lines there would be no CD error in case of a horizontal butting error). Consequently, the final target specifications and pattern type will determine how the required value of the tier widths are chosen in accordance with the soft butting method according to the invention. It is obvious that a larger overlap will reduce the throughput because in this case more exposure stripes will be needed to cover the entire substrate.

Summarizing, the invention provides a novel implementation of the concept of stripe overlap regions in order to achieve a "softening" of misplacements and/or different metrology between adjacent stripes. The stripe overlap is divided into a sequence of grid tiers in which there is a sequential replacement of grid points from one tier to the other, similar to a fade out. The sequence of replacement is done such that the best possible homogeneity is achieved, exploiting the possibility to realize an interlocking of pixels grids that belong to adjacent stripes.

The special advantages of the method according to the invention are:

No additional gray-level correction or adaptation is required. A gray level at any image point can be used without interference with the partitioning of pixels to exposure stripes.

The adverse effect of butting errors is reduced. This is a result of the fact that a butting error will distributed over a sequence of cells, and in one cell the position of only one, or a small number, of the beamlets (i.e., pixels) is changed with respect to the other beams within the cell.

The impact of butting errors on local uniformity of critical design features is drastically reduced. By virtue of the invention, butting errors will cause only very small local pattern deformation and placement errors.

The invention is functional for short and long features running across stripe boundaries. The region of overlap can be effectively minimized by choosing the minimum tier width possible.

The butting specifications for particle-beam tools can be scaled down to the range of a placement specification (which typically is, at 3 sigma, about 1 to 2 nm), rather than CD control specification (typically, at 6 sigma, about 3.5 nm).

The invention claimed is:

1. A method for irradiating a target with a beam of energetic radiation formed by electrically charged particles, comprising:

providing a pattern definition system having a plurality of apertures transparent to said radiation, illuminating said pattern definition system using an illuminating wide beam, which traverses the pattern definition system through said apertures thus forming a patterned beam including a corresponding plurality of beamlets, forming said patterned beam into a pattern image on the location of the target, said pattern image comprising the images of at least part of the plurality of apertures imaged onto a corresponding number of image pixels on the target, and generating a relative movement between said target and the pattern definition system producing a movement of said pattern image on the target along a path over a region where a beam exposure is to be performed, which defines a number of stripes covering said region in sequential exposures, each of said stripes comprising a plurality of image pixels on the target wherein within each stripe the image pixels have non-overlapping nominal positions on the target, wherein within each stripe the movement of said pattern image on the target is parallel to the direction of relative movement between the target and the pattern definition system, wherein the stripes at their boundaries to adjacent stripes comprise overlap margins, each of said overlap margins being located at a stripe boundary oriented parallel to the movement of said pattern image on the target and comprising a plurality of image pixels, wherein said plurality of image pixels is a subset of the image pixels within the respective stripe, and each overlap margin in a stripe is brought into spatial overlap with a corresponding overlap margin of an adjacent stripe wherein nominal positions of image pixels in the overlap margin are overlapping with nominal positions of corresponding image pixels in the corresponding overlap margin, wherein, during the exposure of an overlap margin, a first subset of image pixels in said overlap margin are exposed and a second subset of image pixels in said overlap margin are not exposed, whereas during the exposure of a corresponding overlap margin, image pixels in said corresponding overlap margin which correspond to image pixels in said first subset are not exposed, and image pixels in said corresponding overlap margin which correspond to image pixels in said second subset are exposed.

2. The method of claim 1, wherein the first and second subsets are complementary with regard to the numbers of image pixels in a pixel pattern to be generated on the target within an overlap margin.

3. The method of claim 1, wherein the ratio formed between the number of image pixels in the first subset and the sum of numbers of image pixels in the first and second subsets is decreasing towards an outer boundary of the overlap margin along a direction transverse to the direction of the path defining the respective stripe.

4. The method of claim 3, wherein said ratio decreases in a stepwise manner in a sequence of consecutive sub-regions in the overlap margin.

5. The method of claim 4, wherein the number of said consecutive sub-regions is at least two.

6. The method of claim 5, wherein the number of said consecutive sub-regions is $n^2-1$, where $n \geq 2$.

7. The method of claim 5, wherein the number of said consecutive sub-regions is $2^{2i}-1$, where $i \geq 1$.

8. The method of claim 4, wherein said ratio is expressed with regard to sampling cells of uniform size within the respective overlap margin or sub-region.

9. The method of claim 3, wherein said ratio has at least two different values greater than 0 and smaller than 1.

10. The method of claim 9, wherein said ratio has at least $n^2-1$ values greater than 0 and smaller than 1, where $n \geq 2$.

11. The method of claim 9, wherein said ratio has at least $2^{2i}-1$ values greater than 0 and smaller than 1, where $i \geq 1$.

12. The method of claim 3, wherein said ratio is expressed with regard to sampling cells of uniform size within the respective overlap margin or sub-region.

13. The method of claim 9, wherein the sampling cells are blocks of adjacent image pixels.

14. The method of claim 1, wherein the spatial overlap between an overlap margin and a corresponding overlap margins such that nominal positions of image pixels in the overlap margin are substantially coinciding with nominal positions of corresponding image pixels in the corresponding overlap margin.

15. The method of claim 1, wherein the images of apertures formed on the target have a width that is greater than the distance between neighboring positions of image pixels within each stripe.

16. The method of claim 15, wherein said width of the images of apertures, when expressed in terms of the distance between neighboring image pixel positions, has an integer part which is at least 2.

17. The method of claim 16, wherein said width of the images of apertures, when expressed in terms of the distance between neighboring image pixel positions, has an integer part that is $2^N$ where $N \geq 1$.

* * * * *